(12) United States Patent
Hellmund et al.

(10) Patent No.: US 11,552,048 B2
(45) Date of Patent: Jan. 10, 2023

(54) SEMICONDUCTOR DEVICE INCLUDING AN ELECTRICAL CONTACT WITH A METAL LAYER ARRANGED THEREON

(71) Applicant: Infineon Technologies AG, Neubiberg (DE)

(72) Inventors: Oliver Hellmund, Neubiberg (DE); Barbara Eichinger, Villach (AT); Thorsten Meyer, Regensburg (DE); Ingo Muri, Villach (AT)

(73) Assignee: Infineon Technologies AG, Neubiberg (DE)

( * ) Notice: Subject to any disclaimer, the term of this patent is extended or adjusted under 35 U.S.C. 154(b) by 155 days.

(21) Appl. No.: 17/101,339

(22) Filed: Nov. 23, 2020

(65) Prior Publication Data

US 2021/0167036 A1     Jun. 3, 2021

(30) Foreign Application Priority Data

Nov. 28, 2019    (DE) ...................... 10 2019 132 230.8

(51) Int. Cl.
| | | |
|---|---|---|
| *H01L 23/544* | (2006.01) | |
| *H01L 23/00* | (2006.01) | |
| *H01L 21/78* | (2006.01) | |

(52) U.S. Cl.
CPC .............. *H01L 24/94* (2013.01); *H01L 21/78* (2013.01); *H01L 23/544* (2013.01); *H01L 2223/5446* (2013.01); *H01L 2223/54426* (2013.01)

(58) Field of Classification Search
CPC ....... H01L 24/94; H01L 21/78; H01L 23/544; H01L 2223/54426; H01L 2223/5446; H01L 23/482; H01L 24/33; H01L 24/29; H01L 24/32; H01L 24/83; H01L 2221/68327; H01L 2221/68368; H01L 2224/27505; H01L 2224/29023; H01L 2224/32245; H01L 21/6835; H01L 2224/33181; H01L 2224/83002; H01L 2224/83005;

(Continued)

(56) References Cited

U.S. PATENT DOCUMENTS

| | | |
|---|---|---|
| 7,659,611 B2 | 2/2010 | Otremba |
| 9,318,424 B2 | 4/2016 | Niu et al. |

(Continued)

FOREIGN PATENT DOCUMENTS

| | | |
|---|---|---|
| DE | 10 2005 054 872 | 5/2007 |
| DE | 10 2007 025 950 | 1/2008 |

(Continued)

OTHER PUBLICATIONS

Joachim N. Burghartz, "Ultra-Thin Chip Technology and Applications", Springer 2011.

*Primary Examiner* — Vu A Vu (74) *Attorney, Agent, or Firm* — Dicke, Billig & Czaja, PLLC (57) ABSTRACT

A semiconductor device includes a semiconductor die, an electrical contact arranged on a surface of the semiconductor die, and a metal layer arranged on the electrical contact, wherein the metal layer includes a singulated part of at least one of a metal foil, a metal sheet, a metal leadframe, or a metal plate. When viewed in a direction perpendicular to the surface of the semiconductor die, a footprint of the electrical contact and a footprint of the metal layer are substantially congruent.

17 Claims, 7 Drawing Sheets

(58) Field of Classification Search
CPC . H01L 2224/83097; H01L 2224/83132; H01L 2224/83191; H01L 2224/83385; H01L 2224/8382; H01L 2224/8384; H01L 2224/83895; H01L 2224/83986; H01L 2224/94; H01L 2224/97; H01L 23/488; H01L 24/10; H01L 24/81; H01L 2224/10; H01L 2224/81
USPC .......................................................... 438/462
See application file for complete search history.

(56) References Cited

U.S. PATENT DOCUMENTS

| | | | |
|---|---|---|---|
| 9,613,929 | B2 | 4/2017 | Becker et al. |
| 10,008,465 | B2 * | 6/2018 | Bower ................ H01L 25/0753 |
| 2002/0027276 | A1 | 3/2002 | Sakamoto et al. |
| 2007/0278550 | A1 | 12/2007 | Asai et al. |

FOREIGN PATENT DOCUMENTS

| | | |
|---|---|---|
| DE | 10 2011 115 887 | 4/2013 |
| EP | 2 963 682 | 1/2016 |

* cited by examiner

SEMICONDUCTOR DEVICE INCLUDING AN ELECTRICAL CONTACT WITH A METAL LAYER ARRANGED THEREON

CROSS-REFERENCE TO RELATED APPLICATION

This Utility Patent Application claims priority to German Patent Application No. 10 2019 132 230.8, filed Nov. 28, 2019, which is incorporated herein by reference.

TECHNICAL FIELD

The present disclosure generally relates to semiconductor technology. In particular, the present disclosure relates to semiconductor devices including an electrical contact with a metal layer arranged thereon. The present disclosure further relates to methods for manufacturing such semiconductor devices.

BACKGROUND

Semiconductor wafers for fabricating semiconductor devices are getting thinner and thinner such that the semiconductor wafers and semiconductor dies obtained therefrom may suffer from weak mechanical stability. However, at semiconductor wafer processing and semiconductor die attach high thermomechanical stress may occur. Manufacturers of semiconductor devices are constantly striving to improve their products and methods for manufacturing thereof. It may be desirable to develop semiconductor devices with an increased mechanical stability as well as methods for manufacturing such semiconductor devices.

SUMMARY

An aspect of the present disclosure relates to a semiconductor device. The semiconductor device comprises a semiconductor die. The semiconductor device further comprises an electrical contact arranged on a surface of the semiconductor die. The semiconductor device further comprises a metal layer arranged on the electrical contact, wherein the metal layer comprises a singulated part of at least one of a metal foil, a metal sheet, a metal leadframe, or a metal plate. When viewed in a direction perpendicular to the surface of the semiconductor die, a footprint of the electrical contact and a footprint of the metal layer are substantially congruent.

A further aspect of the present disclosure relates to a method. The method comprises providing a metal layer comprising multiple recesses. The method further comprises providing a semiconductor wafer comprising multiple semiconductor dies, wherein each of the semiconductor dies comprises an electrical contact arranged on a surface of the semiconductor wafer. The method further comprises aligning sections of the metal layer between adjacent recesses with the electrical contacts. The method further comprises joining the electrical contacts and the sections of the metal layer.

BRIEF DESCRIPTION OF THE DRAWINGS

The accompanying drawings are included to provide a further understanding of aspects and are incorporated in and constitute a part of this description. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference signs may designate corresponding similar parts.

DETAILED DESCRIPTION

In the following detailed description, reference is made to the accompanying drawings, in which are shown by way of illustration specific aspects in which the disclosure may be practiced. In this regard, directional terminology, such as "top", "bottom", "front", "back", etc. may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the concept of the present disclosure. Hence, the following detailed description is not to be taken in a limiting sense, and the concept of the present disclosure is defined by the appended claims.

Figure 1:
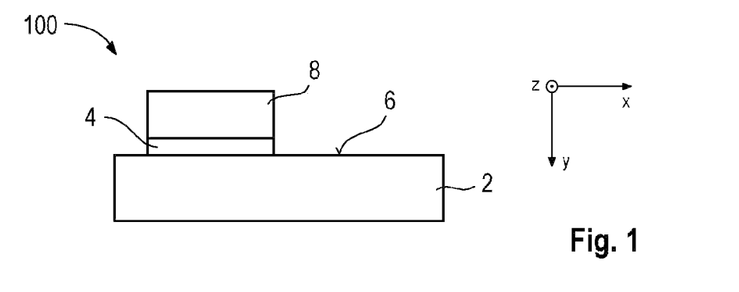
FIG. 1 schematically illustrates a cross-sectional side view of a semiconductor device 100 in accordance with the disclosure.

The semiconductor device 100 of FIG. 1 is illustrated in a general manner in order to qualitatively specify aspects of the disclosure. The semiconductor device 100 may include further aspects which are not illustrated for the sake of simplicity. For example, the semiconductor device 100 may be extended by any of the aspects described in connection with other semiconductor devices and methods in accordance with the disclosure.

The semiconductor device 100 may include a semiconductor die 2. An electrical contact 4 may be arranged on a surface 6 of the semiconductor die 2. In addition, a metal layer 8 may be arranged on the electrical contact 4, wherein the metal layer 8 includes a singulated part of at least one of a metal foil, a metal sheet, a metal leadframe, or a metal plate. When viewed in a direction perpendicular to the surface 6 of the semiconductor die 2, i.e. when viewed in the y-direction, a footprint of the electrical contact 4 and a footprint of the metal layer 8 may be substantially congruent. In this regard, the expression "substantially congruent" may not necessarily imply that the footprints are congruent in a perfect geometrical sense, but that the footprints may also slightly deviate from each other when taking into account manufacturing tolerances in the fabrication of the electrical contact 4 and the metal layer 8. Accordingly, the footprints of the electrical contact 4 and the metal layer 8 may include small non-overlapping parts. For example, the footprint of the electrical contact 4 may be arranged (in particular completely) in the footprint of the metal layer 8 or vice versa. The term "footprint" may be used herein similar to the terms "outline", "outer outline", "contour", or "outer contour".

In general, the semiconductor die 2 may include integrated circuits, passive electronic components, active electronic components, etc. The integrated circuits may be designed as logic integrated circuits, analog integrated circuits, mixed signal integrated circuits, power integrated circuits, etc. In one example, the semiconductor die 2 may be manufactured from an elemental semiconductor material (e.g. Si). In a further example, the semiconductor die 2 may be manufactured from a wide band gap semiconductor material or a compound semiconductor material (e.g. SiC, GaN, SiGe, GaAs). The semiconductor die 2 may be used in any kind of power application such as e.g. MOSFETs (Metal Oxide Semiconductor Field Effect Transistors), half bridge circuits, power modules including a gate driver, etc. In particular, the semiconductor die 2 may include or may be part of a power device like e.g. a power MOSFET, an LV (low voltage) power MOSFET, a power IGBT (Insulated Gate Bipolar Transistor), a power diode, a superjunction power MOSFET, etc.

The method of FIG. 2 is also illustrated in a general manner in order to qualitatively specify aspects of the disclosure. The method may include further aspects which are not illustrated for the sake of simplicity. For example, the method may be extended by any of the aspects described in connection with the method of FIG. 3. The method of FIG. 2 may at least partly be used for manufacturing a semiconductor device similar to FIG. 1.

Figure 2A:
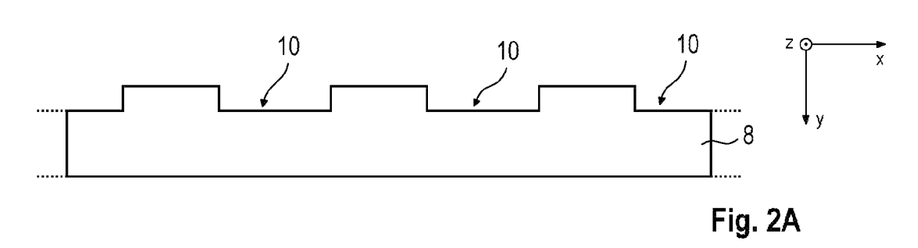
FIG. 2 includes FIGS. 2A to 2D schematically illustrating a cross-sectional side view of a method for manufacturing a semiconductor device in accordance with the disclosure.

In FIG. 2A, a metal layer 8 including multiple recesses (or trenches or cavities) 10 may be provided. In the example of FIG. 2A, only a section of the metal layer 8 including three recesses 10 is illustrated for the sake of simplicity. The metal layer 8 may further extend in the x-direction and z-direction (see horizontal dotted lines) and may thus include an arbitrary number of additional recesses 10.

Figure 2B:
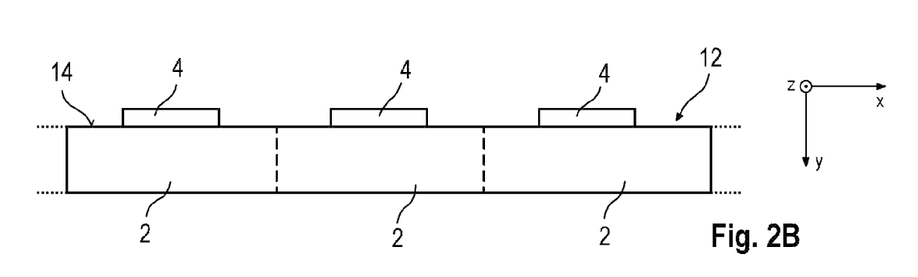

In FIG. 2B, a semiconductor wafer 12 including multiple semiconductor dies 2 may be provided. Each of the semiconductor dies 2 may include one or more electrical contacts 4 arranged on a surface 14 of the semiconductor wafer 12. The vertical dashed lines indicate locations at which the semiconductor wafer 12 may be singulated into the multiple semiconductor dies 2 later on.

Figure 2C:
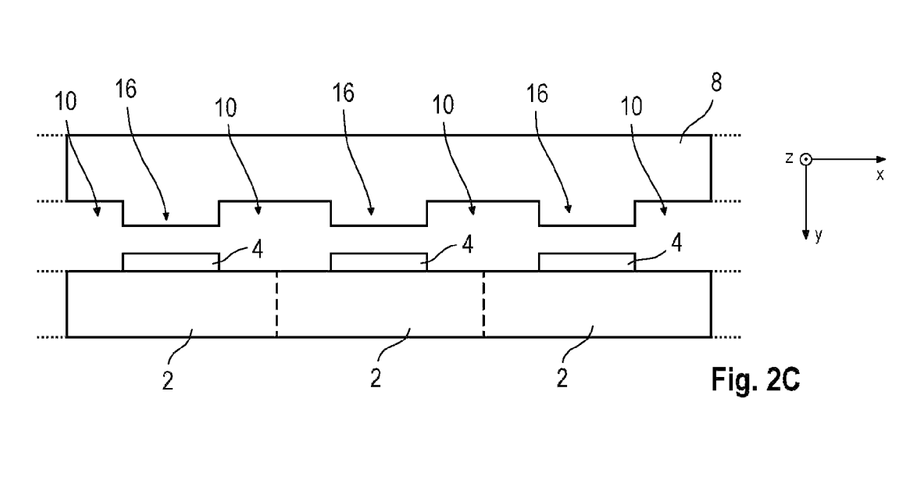

In FIG. 2C, sections 16 of the metal layer 8 between adjacent recesses 10 may be aligned with the electrical contacts 4 of the semiconductor dies 2. The footprints of the electrical contacts 4 and the footprints of the sections 16 may be substantially congruent when viewed in the y-direction.

Figure 2D:
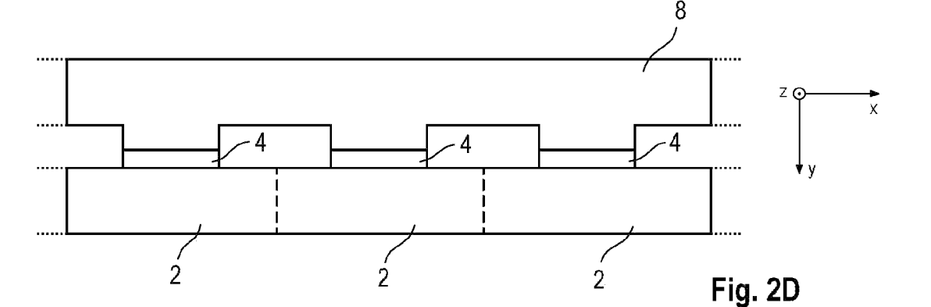

In FIG. 2D, the electrical contacts 4 of the semiconductor dies 2 and the sections 16 of the metal layer 8 may be joined together. Exemplary joining techniques are specified below and may particularly depend on the specific materials of the electrical contacts 4 and the metal layer 8.

The method of FIG. 3 may be seen as a more detailed implementation of the method of FIG. 2. Details of the method described below may thus be likewise applied to the method of FIG. 2. In addition, the manufactured semiconductor device 300 may be seen as a more detailed implementation of the semiconductor device 100 of FIG. 1.

Figure 3A:
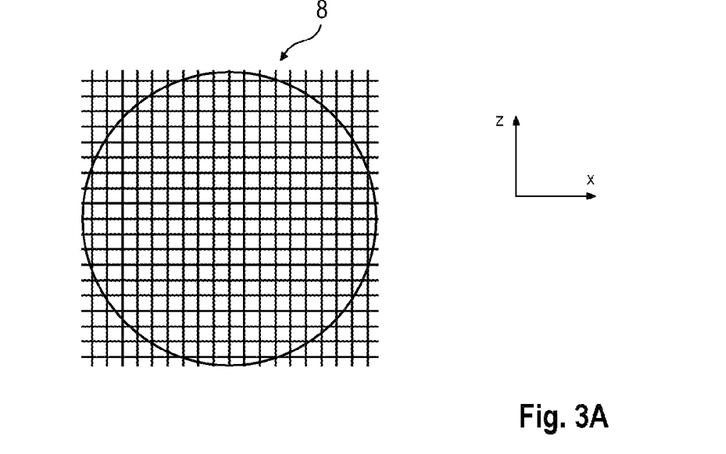
FIG. 3 includes FIGS. 3A to 3P schematically illustrating a method for manufacturing a semiconductor device 300 in accordance with the disclosure.

FIG. 3A illustrates a top view of a metal layer 8. The shape of the metal layer 8 may be similar to the shape of a semiconductor wafer or a semiconductor panel used for manufacturing semiconductor devices in accordance with the disclosure. In the example of FIG. 3A, the shape of the metal layer 8 may be circular. In further examples, the shape of the metal layer 8 may be square or rectangular. The semiconductor wafer may be singulated into multiple semiconductor dies later on. The singulation may be performed along scribe lines which may form a mesh of small squares or rectangles as illustrated in FIG. 3A.

The metal layer 8 may be made of or may include a metal or metal alloy configured to be joined to electrical contacts of semiconductor dies later on. In particular, the metal layer 8 may be fabricated from at least one of copper, copper alloy, molybdenum, or molybdenum alloy. The metal layer 8 may be made of or may include at least one of a metal foil, a metal sheet, a metal leadframe, or a metal plate. In this regard, the metal layer 8 may be formed by only one metal layer or a stack of multiple metal layers.

Figure 3B:
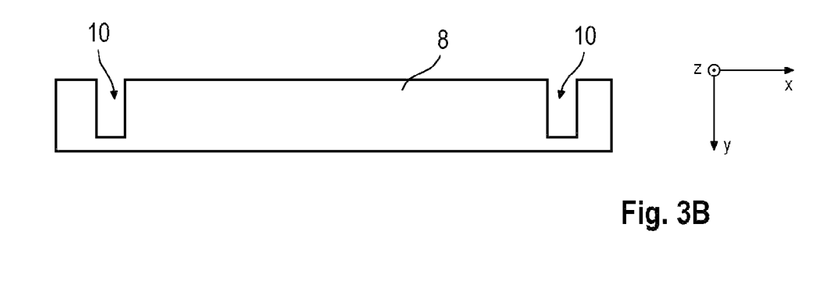

In FIG. 3B, the metal layer 8 may be structured by manufacturing multiple recesses 10 in an upper surface of the metal layer 8. The metal layer 8 may be structured separately from the semiconductor wafer. The recesses 10 may be manufactured by any suitable technique such as e.g. sawing, cutting, applying a laser beam, milling, wet etching, plasma etching, etc. An aspect ratio (depth:width) of the recesses 10 may have a value of e.g. 2:1. In the example of FIG. 3B, the recesses 10 may have a rectangular form. In further examples, the recesses 10 may have a rounded form, a V-shaped form, a polygonal form, etc., depending on the chosen manufacturing technique. The example of FIG. 3B only shows two recesses 10 arranged in the upper surface of the metal layer 8 for the sake of simplicity. As will become apparent later on, the locations of the recesses 10 in the metal layer 8 may depend on the positions of at least one of scribe lines of the semiconductor wafer or electrical contacts of the semiconductor dies that are to be manufactured from the semiconductor wafer.

A thickness of the metal layer 8 in the y-direction may be greater than about 20 micrometer, or greater than about 30 micrometer, or greater than about 40 micrometer, or greater than about 50 micrometer. A maximum thickness of the metal layer 8 may e.g. depend on a kerf width. For example, a kerf width of about 30 micrometer may result in a maximum thickness of the metal layer 8 in a range from about 55 micrometer to about 65 micrometer when structuring the metal layer 8 on one surface only (see FIG. 3B). In case of a double sided structuring (see FIG. 3D), a kerf width of about 30 micrometer may result in a thickness of the metal layer 8 in a range from about 90 micrometer to about 130 micrometer.

Figure 3C:
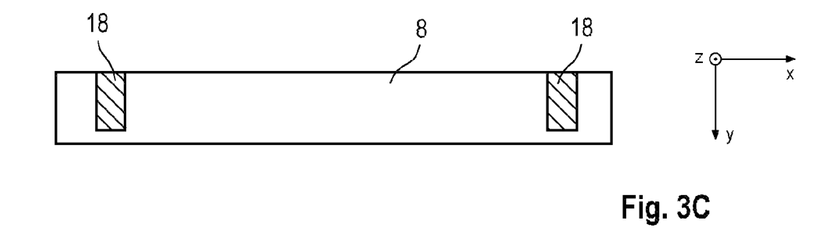

In FIG. 3C, the recesses 10 may be filled with an electrically insulating material 18. After the filling act, the upper surface of the metal layer 8 and the upper surface of the electrically insulating material 18 may be coplanar, i.e. may lie in a common plane. The electrically insulating material 18 may include at least one of a resist, an epoxy, an imide, or a mold compound. A mold compound may include at least one of the following materials: epoxy, filled epoxy, glass fiber filled epoxy, imide, thermoplast, thermoset polymer, polymer blend. In the example of FIG. 3C, the recesses 10 may only partly extend into the metal layer 8 such that bottom surfaces of the recesses 10 may be formed by the material of the metal layer 8. In a further example, the recesses 10 may fully extend from the upper surface of the metal layer 8 to the lower surface of the metal layer 8. Here, the recesses 10 may be completely filled with the electrically insulating material 18. In particular, the upper surface of the electrically insulating material 18 may be coplanar with the upper surface of the metal layer 8, and the lower surface of the electrically insulating material 18 may be coplanar with the lower surface of the metal layer 8.

Figure 3D:
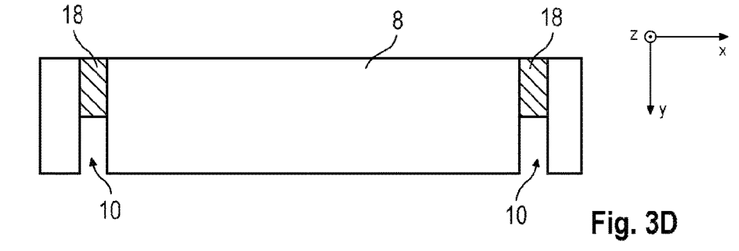

FIG. 3D illustrates an alternative example of a metal foil 8 which may be structure on both surfaces. When manufacturing the metal layer 8 of FIG. 3D, recesses 10 may be formed on opposite sides of the metal layer 8. The electrically insulating material 18 may be filled in one of the surfaces of the metal layer 8. In the example of FIG. 3D, the electrically insulating material 18 may form a bottom surface of the recesses 10 arranged in the lower surface of the metal layer 8. The acts described in the following are based on a metal layer 8 structured on one surface only (see FIG. 3B), but may be similarly applied to double-side structured metal layer 8 (see FIG. 3D).

Figure 3E:
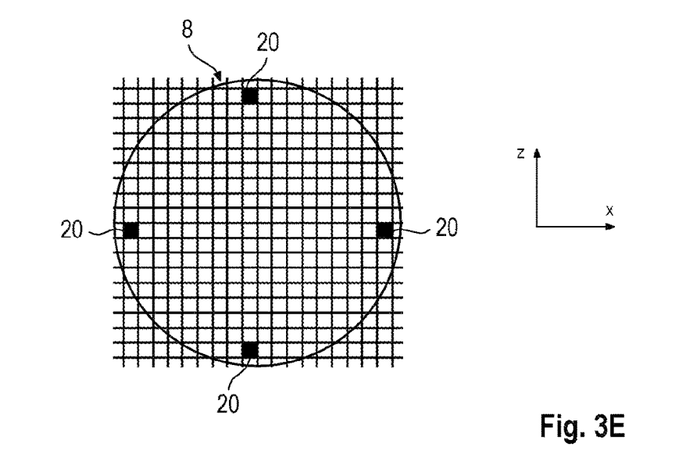

In FIG. 3E, at least two openings 20 in the metal layer 8 may be manufactured, for example by at least one of etching or stamping. The openings 20 may be configured as alignment marks for aligning the metal layer 8 with the semiconductor wafer. For example, an opening 20 may be manufactured by removing a semiconductor die from the semiconductor wafer. The metal layer 8 of FIG. 3E shows an exemplary number of four openings 20.

Figure 3F:
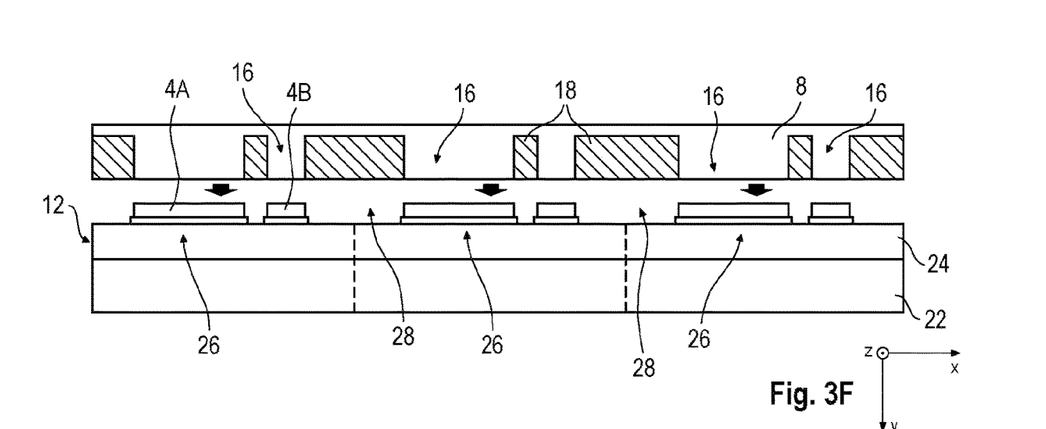

In FIG. 3F, a semiconductor wafer 12 may be provided. The semiconductor wafer 12 may include a semiconductor substrate 22 and a device layer 24 arranged in the semiconductor substrate 22. The device layer 24 may include microelectronic devices that may have been integrated in the semiconductor substrate 22 by applying various microfabrication processes, such as e.g. doping, ion implantation, etching, thin-film deposition of various materials, photolithographic patterning, etc.

In the example of FIG. 3F, the device layer 24 may exemplarily include multiple semiconductor devices located between the vertical dashed lines. In particular, the semiconductor devices may be power semiconductor devices such as e.g. power transistors, power diodes, etc. In the illustrated example, the semiconductor devices may be power MOSFETs 26 with each of the integrated power MOSFETs 26 including two electrical contacts 4A, 4B arranged on the upper surface of the semiconductor wafer 12. For example, the electrical contacts 4A, 4B may be made of at least one of copper, copper alloy, molybdenum, or molybdenum alloy. The electrical contacts 4A and 4B may correspond to source contacts and gate contacts of the power MOSFETs 26, respectively, and may be electrically coupled to respective electronic structures in the device layer 24. The drain contacts of the power MOSFETs 26 may be manufactured later on. In the example of FIG. 3F, the power MOSFETs 26 may have a vertical structure, i.e. the power MOSFETs 26 may include electrodes arranged over the two main faces of the power MOSFETs 26 such that electric currents may substantially flow in the vertical y-direction. In further examples, the power MOSFETs 26 may have a lateral structure, i.e. the power MOSFETs 26 may include electrodes arranged over one of the main faces such that electric currents may substantially flow in the lateral x-direction.

In FIG. 3F, a metal layer 8 may be provided. The metal layer 8 may include multiple recesses filled with an electrically insulating material 18 as well as sections 16 arranged between the filled recesses. When viewed in the y-direction, the footprints of the sections 16 may be substantially congruent with the footprints of the electrical contacts 4A, 4B.

The sections 16 of the metal layer 8 may be aligned with the electrical contacts 4A, 4B such that one section 16 may be arranged over one of the electrical contacts 4A, 4B, respectively. Accordingly, the recesses filled with the electrically insulating material 18 may be aligned with scribe lines 28 of the semiconductor wafer 12 and/or with sections of the semiconductor wafer 12 arranged between the electrical contacts 4A, 4B. A proper alignment may be provided by using the openings 20 of the metal layer 8 as alignment marks (see FIG. 3E). During the alignment act the metal layer 8 may be arranged over a temporary carrier (not illustrated) which may be removed later on. For example, the metal layer 8 may be fixed to the temporary carrier by at least one of glue, a clamping ring, or a clamping plate.

Figure 3G:
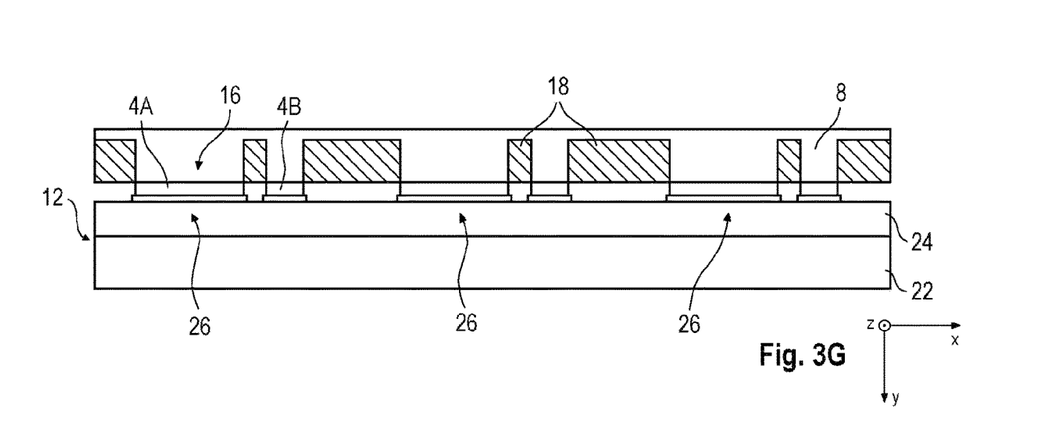

In FIG. 3G, the electrical contacts 4A, 4B and the sections 16 of the metal layer 8 may be brought in mechanical contact and may be joined together. More particular, the upper surfaces of the electrical contacts 4A, 4B may be joined to the lower surfaces of the sections 16. For example, the joining act may include at least one of a diffusion bonding act, a pre-sintering act, or a sintering act. A metal-to-metal interface between an electrical contact 4A, 4B and the respective section 16 of the metal layer 8 may be obtained. Depending on the chosen joining technique, the metal-to-metal interface may include at least one of a bonding interface or a sintering interface. For example, the metal-to-metal interface may include an inhomogeneity in the grain structure of the joined metals. That is, even when the electrical contacts 4A, 4B and the metal layer 8 may be fabricated from a same or similar material, the metal-to-metal interface may still be detectable by suitable detection techniques.

In one example, the electrical contacts 4A, 4B and the sections 16 of the metal layer 8 may be joined by applying a diffusion bonding act. A temperature of the diffusion bonding act may lie in a range from about 100 degree Celsius to about 260 degree Celsius, more particular from about 160 degree Celsius to about 240 degree Celsius, more particular from about 180 degree Celsius to about 220 degree Celsius. An exemplary specific temperature value of the diffusion bonding act may be about 200 degree Celsius. A duration of the diffusion bonding act may lie in a range from about 5 minutes to about 3 hours, more particular from about 15 minutes to about 2 hours, more particular from about 30 minutes to about 1 hour. In one example, the diffusion bonding act may be based on a two-step approach including a first step based on the above identified process parameters. In a second step, the temperature may increase to a higher value in a range from about 380 degree Celsius to about 420 degree Celsius.

In a further example, the electrical contacts 4A, 4B and the sections 16 of the metal layer 8 may be joined by applying a pre-sintering act. A temperature of the pre-sintering act may lie in a range from about 160 degree Celsius to about 240 degree Celsius, more particular from about 180 degree Celsius to about 220 degree Celsius. An exemplary specific temperature value of the pre-sintering act may be about 200 degree Celsius. A duration of the pre-sintering act may lie in a range from about 1 minute to about 30 minutes, more particular from about 5 minutes to about 30 minutes hours. A pressure applied during the pre-sintering act may particularly depend on the materials that are to be joined and may lie in a range from about 15 MPa to about 30 MPa. An additional sintering act may be applied later on.

Figure 3H:
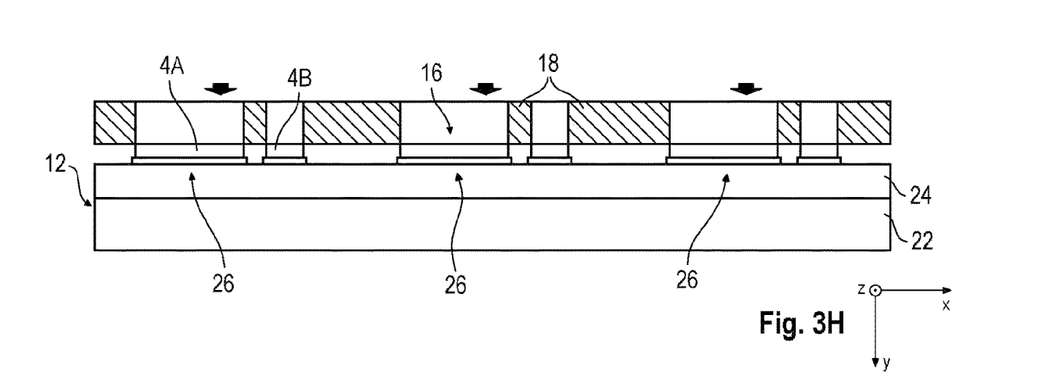

In FIG. 3H, material may be removed from the upper surface of the metal layer 8 (see arrows) until the upper surfaces of the electrically insulating material 18 may become exposed. For the case of the electrically insulating material 18 already fully extending from the upper surface of the metal layer 8 to the lower surface of the metal layer 8, removing the material may not be required. For example, removing the material may include at least one of a grinding act or an etching act. In this regard, the electrically insulating material 18 may be configured to protect the upper structures of the power MOSFETs 26 during the material removal act. Furthermore, the electrically insulating material 18 may be configured to stabilize the metal layer 8 during the removal of the material. Removing the material of the metal layer 8 may result in a planarization of the arrangement's upper surface. That is, after removing the material of the metal layer 8, the upper surface of the metal layer 8 and the upper surfaces of the electrically insulating material 18 may be coplanar, i.e. may lie in a common plane. Removing the conductive material may eliminate the risk of shortages. In addition, the conductive material may be removed from areas at which laser radiation may be applied in a later singulation act.

Figure 3I:
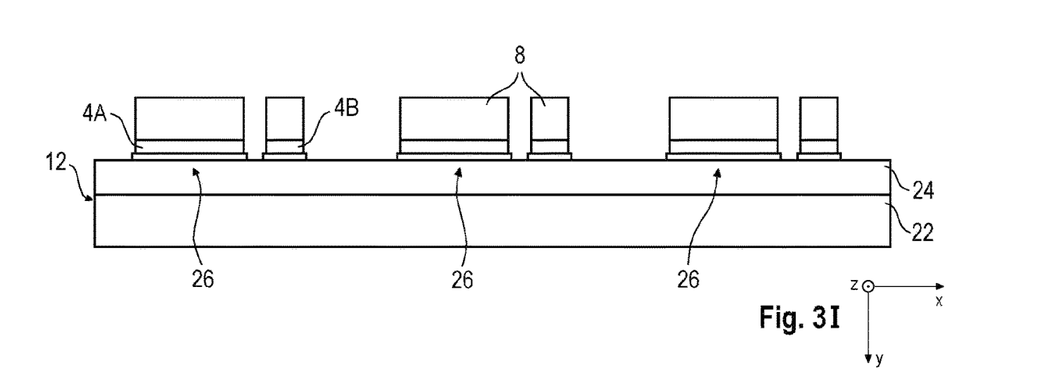

In FIG. 3I, the (sacrificial) electrically insulating material 18 may be removed. In this regard, the distances between the electrical contacts 4A, 4B may be particularly large enough for allowing such subtractive process. The technique for removing the electrically insulating material 18 may depend on the respective material type. For example, a resist may be removed by applying a resist cleaner. After removing the electrically insulating material 18, a further sintering act may be applied. A temperature of the sintering act may lie in a range from about 250 degree Celsius to about 400 degree Celsius. In addition, a packaging act (not illustrated) may be performed by applying at least one of a resist, a mold compound, or an epoxy to the upper surface of the semiconductor wafer 12.

Figure 3J:
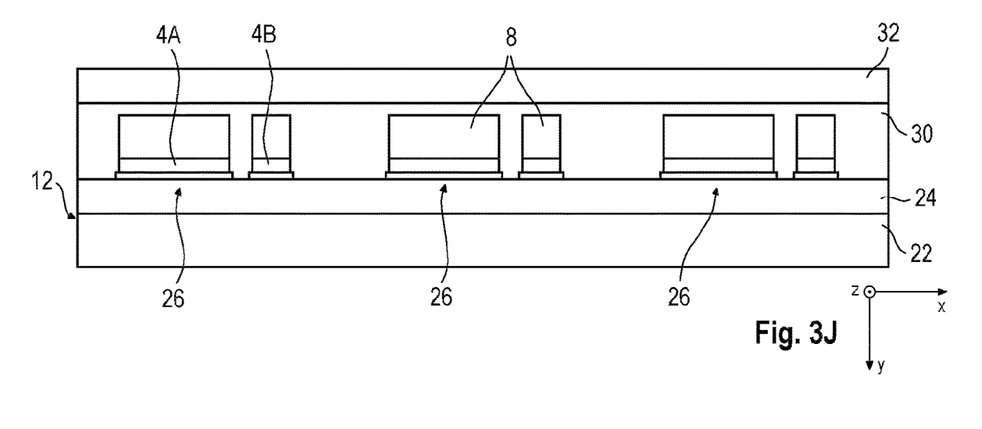

In FIG. 3J, a glue 30 may be applied to the upper surface of the semiconductor wafer 12. In particular, the applied glue 30 may cover the side surfaces and the upper surfaces of the electrical contacts 4A, 4B. In addition, a (temporary) carrier 32 may be arranged over the applied glue 30. The glue 30 may be curable, for example by applying ultraviolet (UV) electromagnetic radiation. In accordance therewith, the carrier 32 may be transparent in the UV range in order to allow UV radiation to pass its material. In one example, the carrier 32 may be made of a glass material. The material properties of the glue 30 may have a limiting effect on the fabrication acts of FIG. 3. For example, the glue 30 may withstand a maximum temperature for a limited time only. An exemplary value for such maximum temperature may be about 270 degree Celsius. In a more specific example, the glue 30 may only withstand a temperature of about 200 degree Celsius for about 20 minutes. In particular, the material properties of the glue 30 may have a limiting effect on the temperature and/or duration of a sintering process.

Figure 3K:
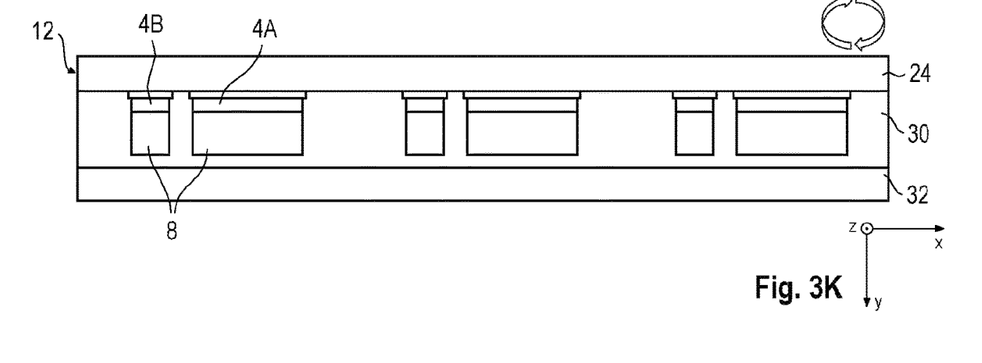

In FIG. 3K, the arrangement of FIG. 3J may be flipped, i.e. turned over by 180 degrees (see arrows). In addition, the backside of the semiconductor wafer 12 may be thinned, for example by applying at least one of a grinding act or an etching act. By thinning the semiconductor wafer 12, redundant semiconductor material of the semiconductor wafer 12 may be removed. After the thinning act, the device layer 24 may be left at least. A thickness of the thinned semiconductor wafer 12 in the y-direction may depend on the type of microelectronic devices integrated in the semiconductor material. For example, a thickness may be smaller than about 80 micrometer, or smaller than about 60 micrometer, or smaller than about 40 micrometer, or smaller than about 20 micrometer, or smaller than about 10 micrometer, or smaller than about 5 micrometer. An exemplary value for a thickness of a thinned semiconductor wafer 12 including LV power MOSFETs may even be down to about 3 micrometer.

Figure 3L:
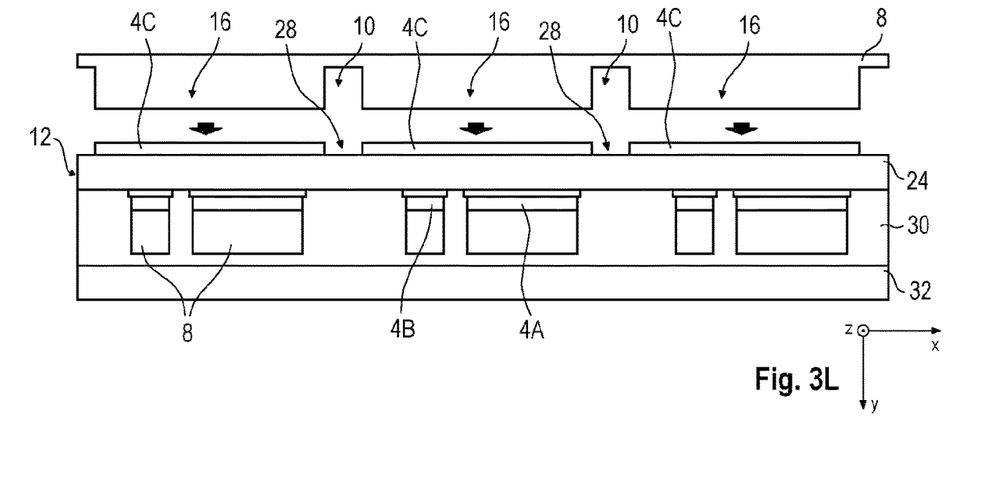

In FIG. 3L, electrical contacts 4C may be manufactured on the upper surface of the device layer 24, for example by applying a suitable metallization technique. In the example of FIG. 3L, the electrical contacts 4C may be already structured after the metallization process. In a further example, a non-structured metallization layer may be manufactured over substantially the entire upper surface of the device layer 24, and the electrical contacts 4C may be formed by a singulation process later on, for example using a multibeam-ns-laser.

In the example of FIG. 3L, the electrical contacts 4C may correspond to drain contacts of the power MOSFETs 26 which may be electrically connected to respective electronic structures in the device layer 24. Similar to the electrical contacts 4A, 4B, the electrical contacts 4C may be made of at least one of copper, copper alloy, molybdenum, or molybdenum alloy. A thickness of the electrical contacts 4C in the y-direction may depend on a technique that may be used for joining the electrical contacts 4C to a metal layer later on. In case of a sintering technique, a thickness of the electrical contacts 4C in the y-direction may lie in a range from about 10 micrometer to about 100 micrometer. More particular, the thickness may lie in a range from about 10 micrometer to about 30 micrometer, or in a range from about 50 micrometer to about 100 micrometer. In case of a diffusion bonding technique, a thickness of the electrical contacts 4C in the y-direction may be smaller than about 10 micrometer, more particular smaller than about 5 micrometer.

In FIG. 3L, a further metal layer 8 may be provided. The metal layer 8 may include multiple recesses 10 and sections 16 arranged in between. When viewed in the y-direction, the footprints of the sections 16 may be substantially congruent to the footprints of the electrical contacts 4C. In the example of FIG. 3L, the recesses 10 in the metal layer 8 may remain unfilled. In further examples, the recesses 10 may be filled with a (sacrificial) electrically insulating material as discussed in connection with previous figures.

The sections 16 of the metal layer 8 may be aligned with the electrical contacts 4C such that one section 16 may be arranged over one of the electrical contacts 4C, respectively. Accordingly, the recesses 10 may be aligned with scribe lines 28 of the semiconductor wafer 12. A proper alignment may be obtained by using openings 20 of the metal layer 8 as alignment marks.

Figure 3M:
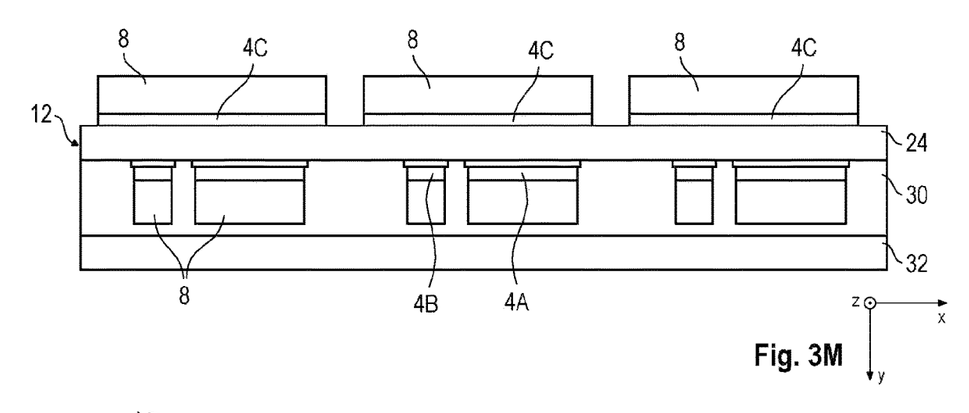

In FIG. 3M, the electrical contacts 4C and the sections 16 of the metal layer 8 may be brought in mechanical contact and may be joined together similar to FIG. 3G. After the joining act, material may be removed from the upper surface of the metal layer 8 until the sections 16 of the metal layer 8 are separated from each other. For example, the material may be removed by applying at least one of a grinding act or an etching act. Removing the material may result in a planarization of the arrangement's upper surface. That is, after removing the material of the metal layer 8, the upper surfaces of the separated sections of the metal layer 8 may be coplanar, i.e. may lie in a common plane.

Figure 3N:
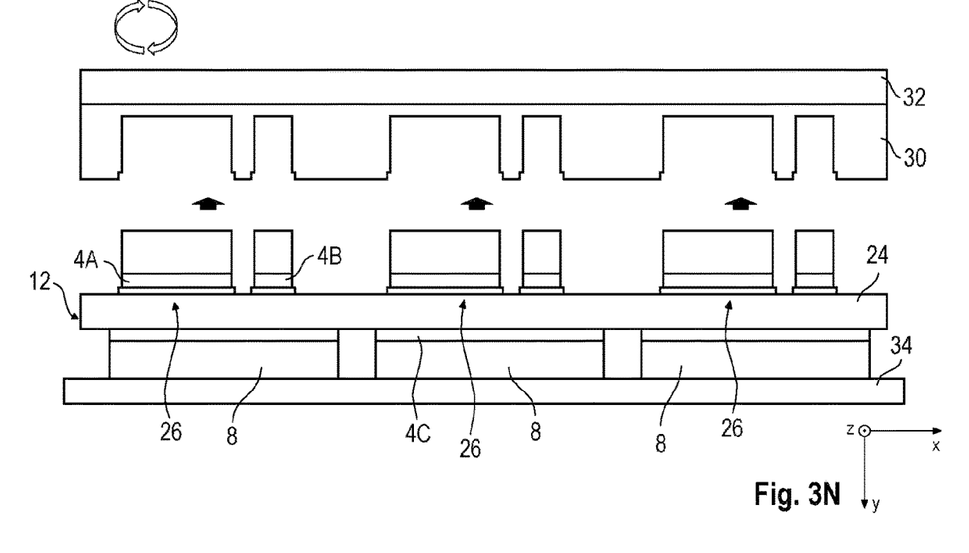

In FIG. 3N, the arrangement of FIG. 3M may be flipped (see arrows). The flipped arrangement may be placed on a temporary carrier 34 such as e.g. a sawing frame. The glue 30 may be cured, e.g. by applying UV radiation passing through the carrier 32, such that the carrier 32 and the glue 30 may be removed.

Figure 3O:
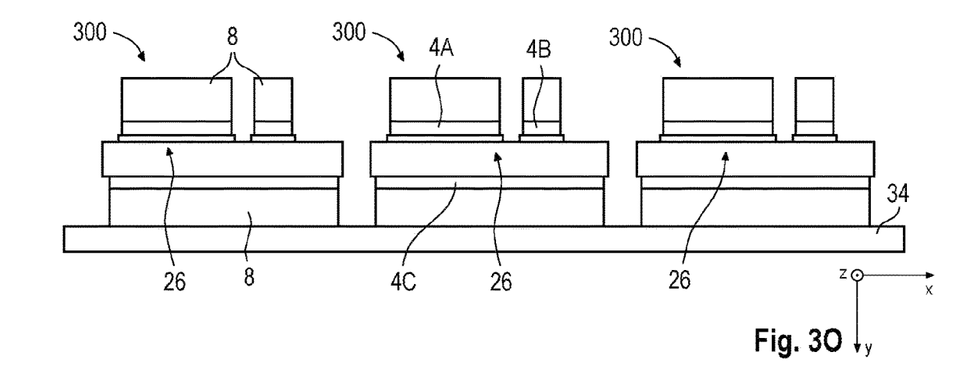

In FIG. 3O, the arrangement may be singulated into multiple semiconductor devices 300 by removing semiconductor material between the individual power MOSFETs 26 of the semiconductor wafer 12. The singulation act may include at least one of sawing, cutting, applying a laser beam, milling, etching. The drain contacts 4C of the singulated power MOSFETs 26 may substantially cover the entire lower surface of the semiconductor devices 300.

In the example of FIG. 3O, each of the fabricated semiconductor devices 300 may include a metal layer 8 over each of the electrical contacts 4A to 4C, respectively. In a further example, the fabricated semiconductor devices may only include metal layers over the electrical contacts 4A, 4B on the upper surface of the semiconductor device. In yet a further example, the fabricated semiconductor devices may only include a metal layer over the electrical contact 4C on the lower surface of the semiconductor device.

Figure 3P:
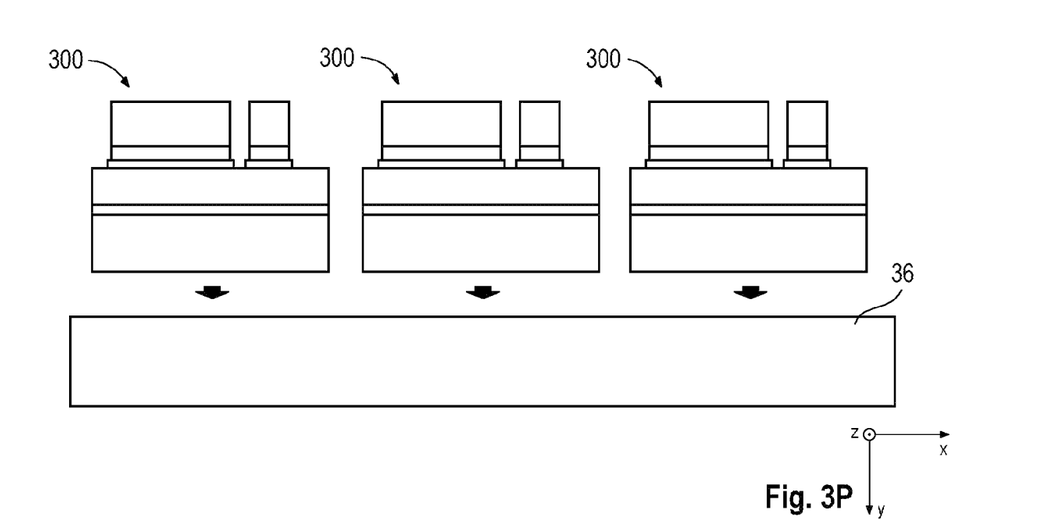

In FIG. 3P, the carrier 34 may be removed and one or more of the semiconductor devices 300 may be arranged on a leadframe 36 in a die attach act. The semiconductor devices 300 may be further processed, wherein further possible processing acts are not explicitly described herein for the sake of simplicity. In an exemplary further act, the semiconductor devices 300 may be encapsulated by a molding compound and singulated in multiple packaged semiconductor devices later on.

Figure 4:
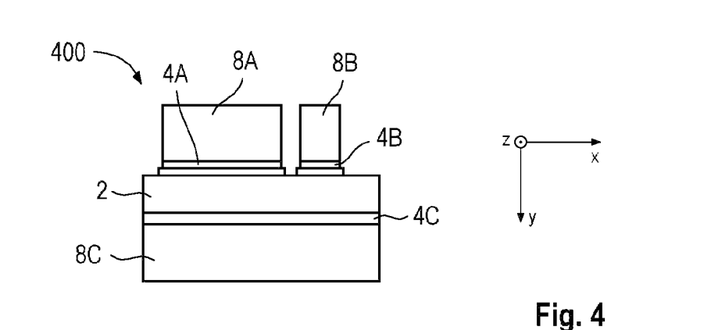
FIG. 4 schematically illustrates a cross-sectional side view of a semiconductor device 400 in accordance with the disclosure.

The semiconductor device 400 of FIG. 4 may be seen as a more detailed implementation of the semiconductor device 100 of FIG. 1. For example, the semiconductor device 400 may be manufactured according to the method of FIG. 3.

The semiconductor device 400 may include a semiconductor die 2. In the example of FIG. 4, the semiconductor die 2 may include a power MOSFET with two electrical contacts 4A, 4B arranged on the upper surface of the semiconductor die 2 and a third electrical contact 4C arranged over the lower surface of the semiconductor die 2. Intermediate electrically conductive layers may be arranged between the semiconductor die 2 and the electrical contacts 4A, 4B. The electrical contacts 4A and 4B may correspond to a source contact and a gate contact of the semiconductor die 2, respectively. In addition, the electrical contact 4C may correspond to a drain contact of the semiconductor die 2. Metal layers 8A to 8C may be arranged over the electrical contacts 4A to 4C, respectively. Each of the metal layers 8A to 8C may include or may correspond to a singulated part of at least one of a metal foil, a metal sheet, a metal leadframe, or a metal plate. When viewed in the y-direction, the footprints of the electrical contacts 4A to 4C and the footprints of the metal layers 8A to 8C may be substantially congruent, respectively. In a further example (not illustrated), the semiconductor die 2 may include a bipolar transistor, wherein the electrical contacts 4A to 4C may correspond to base, emitter, and collector.

A thickness of the semiconductor die 2 in the y-direction may be smaller than about 80 micrometer, or smaller than about 60 micrometer, or smaller than about 40 micrometer, or smaller than about 20 micrometer, or smaller than about 10 micrometer, or smaller than about 5 micrometer. An exemplary value for a thickness of an LV power MOSFET may even be down to about 3 micrometer.

A thickness of the metal layers 8A to 8C in the y-direction may lie in a range from about 40 micrometer to about 130 micrometer.

A thickness of the electrical contacts 4A, 4B in the y-direction may be smaller than about 15 micrometer, or smaller than about 10 micrometer. A thickness of the electrical contact 4C in the y-direction may depend on the technique which may have been used for joining the electrical contact 4C and the metal layer 8C. In case of a sintering technique, a thickness of the electrical contact 4C in the y-direction may lie in a range from about 10 micrometer to about 100 micrometer. More particular, the thickness may lie in a range from about 10 micrometer to about 30 micrometer, or in a range from about 50 micrometer to about 100 micrometer. In case of a diffusion bonding technique, a thickness of the electrical contact 4C in the y-direction may be smaller than about 10 micrometer, more particular smaller than about 5 micrometer.

Due to the additional metal layers 8A to 8C arranged over the electrical contacts 4A to 4C, the overall thickness of the semiconductor device 400 in the y-direction may be increased compared to conventional semiconductor devices. The increased thickness may provide an increased mechanical stability which may e.g. withstand thermomechanical stress at die attach. This may e.g. provide an increased yield in a pick-and-place process.

Due to the additional metal layers 8A to 8C arranged over the electrical contacts 4A to 4C, the thicknesses of the electrical contacts 4A to 4C may be chosen smaller compared to thicknesses of respective electrical contacts of conventional semiconductor devices. Metallization acts for manufacturing the electrical contacts 4A to 4C may thus be reduced or even completely omitted. Reduced metallization acts may result in cost savings in manufacturing the respective semiconductor devices.

Figure 5:
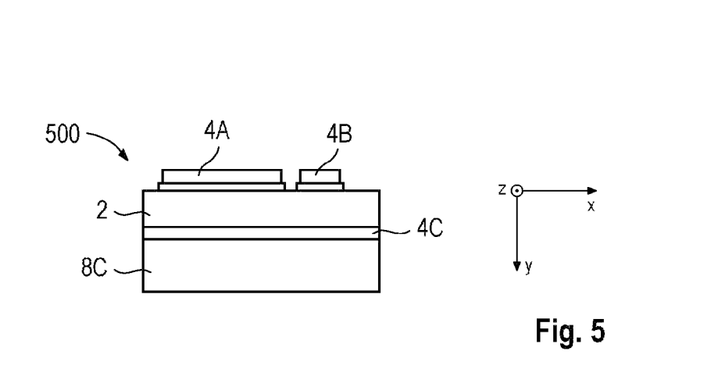
FIG. 5 schematically illustrates a cross-sectional side view of a semiconductor device 500 in accordance with the disclosure.

The semiconductor device 500 of FIG. 5 may be at least partly similar to the semiconductor device 400 of FIG. 4. In contrast to FIG. 4, the semiconductor device 500 may include only one metal layer 8C arranged over the electrical contact 4C on the lower surface of the semiconductor die 2. In yet a further example (not illustrated), a manufactured semiconductor device may only include metal layers 4A, 4B arranged over the electrical contacts 4A, 4B on the upper surface of the semiconductor die 2.

EXAMPLES

In the following, semiconductor devices and methods for manufacturing thereof will be explained by means of examples.

Example 1 is a semiconductor device, comprising: a semiconductor die; an electrical contact arranged on a surface of the semiconductor die; and a metal layer arranged on the electrical contact, wherein the metal layer comprises a singulated part of at least one of a metal foil, a metal sheet, a metal leadframe, or a metal plate, wherein, when viewed in a direction perpendicular to the surface of the semiconductor die, a footprint of the electrical contact and a footprint of the metal layer are substantially congruent.

Example 2 is a semiconductor device according to Example 1, wherein a thickness of the semiconductor die in a direction perpendicular to the surface of the semiconductor die is less than 80 micrometer.

Example 3 is a semiconductor device according to Example 1 or 2, wherein a thickness of the metal layer in a direction perpendicular to the surface of the semiconductor die lies in a range from 40 micrometer to 130 micrometer.

Example 4 is a semiconductor device according to one of the preceding Examples, wherein a thickness of the electrical contact in a direction perpendicular to the surface of the semiconductor die is smaller than 15 micrometer.

Example 5 is a semiconductor device according to one of the preceding Examples, wherein the semiconductor die comprises a power semiconductor device.

Example 6 is a semiconductor device according to one of the preceding Examples, wherein at least one of the metal layer or the electrical contact is made of at least one of copper, copper alloy, molybdenum, or molybdenum alloy.

Example 7 is a semiconductor device according to one of the preceding Examples, further comprising: a metal-to-metal interface between the electrical contact and the metal layer, wherein the metal-to-metal interface comprises at least one of a bonding interface or a sintering interface.

Example 8 is a semiconductor device according to one of the preceding Examples, wherein each of the metal layer and the electrical contact covers the entire surface of the semiconductor die.

Example 9 is a semiconductor device according to one of the preceding Examples, further comprising: a further electrical contact arranged on a further surface of the semiconductor die; and a further metal layer arranged on the further electrical contact, wherein, when viewed in a direction perpendicular to the further surface, a footprint of the further electrical contact and a footprint of the further metal layer are substantially congruent.

Example 10 is a method, comprising: providing a metal layer comprising multiple recesses; providing a semiconductor wafer comprising multiple semiconductor dies, wherein each of the semiconductor dies comprises an electrical contact arranged on a surface of the semiconductor wafer; aligning sections of the metal layer between adjacent recesses with the electrical contacts; and joining the electrical contacts and the sections of the metal layer.

Example 11 is a method according to Example 10, wherein footprints of the electrical contacts and footprints of the sections of the metal layer are substantially congruent, when viewed in a direction perpendicular to the surface of the semiconductor wafer.

Example 12 is a method according to Example 10 or 11, wherein joining the electrical contacts and the sections of the metal layer comprises at least one of a diffusion bonding act, a pre-sintering act, or a sintering act.

Example 13 is a method according to one of Examples 10 to 12, further comprising: aligning recesses of the metal layer with scribe lines of the semiconductor wafer.

Example 14 is a method according to one of Examples 10 to 13, further comprising: before joining the electrical contacts and the sections of the metal layer, filling the recesses with an electrically insulating material.

Example 15 is a method according to Example 14, wherein the electrically insulating material comprises at least one of a resist, an epoxy, an imide, or a mold compound.

Example 16 is a method according to Example 14 or 15, further comprising: after joining the electrical contacts and the sections of the metal layer, removing material from a surface of the metal layer until the electrically insulating material is uncovered at the surface of the metal layer; and removing the electrically insulating material.

Example 17 is a method according to one of Examples 10 to 16, wherein the metal layer comprises at least one of a metal foil, a metal sheet, a metal leadframe, or a metal plate.

Example 18 is a method according to one of Examples 10 to 17, further comprising: providing at least two openings in the metal layer; and aligning the metal layer with the semiconductor wafer based on using the openings as alignment marks.

Example 19 is a method according to one of Examples 10 to 18, further comprising: singulating the metal layer and the semiconductor wafer into multiple semiconductor devices.

As employed in this specification, the terms "connected", "coupled", "electrically connected", and/or "electrically coupled" may not necessarily mean that elements must be directly connected or coupled together. Intervening elements may be provided between the "connected", "coupled", "electrically connected", or "electrically coupled" elements.

Further, the word "over" used with regard to e.g. a material layer formed or located "over" a surface of an object may be used herein to mean that the material layer may be located (e.g. formed, deposited, etc.) "directly on", e.g. in direct contact with, the implied surface. The word "over" used with regard to e.g. a material layer formed or located "over" a surface may also be used herein to mean that the material layer may be located (e.g. formed, deposited, etc.) "indirectly on" the implied surface with e.g. one or multiple additional layers being arranged between the implied surface and the material layer.

Furthermore, to the extent that the terms "having", "containing", "including", "with", or variants thereof are used in either the detailed description or the claims, such terms are intended to be inclusive in a manner similar to the term "comprising". That is, as used herein, the terms "having", "containing", "including", "with", "comprising", and the like are open-ended terms that indicate the presence of stated elements or features, but do not preclude additional elements or features. The articles "a", "an", and "the" are intended to include the plural as well as the singular, unless the context clearly indicates otherwise.

Moreover, the word "exemplary" is used herein to mean serving as an example, instance, or illustration. Any aspect or design described herein as "exemplary" is not necessarily to be construed as advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or multiple" unless specified otherwise or clear from context to be directed to a singular form. Also, at least one of A and B or the like generally means A or B or both A and B.

Devices and methods for manufacturing devices are described herein. Comments made in connection with a described device may also hold true for a corresponding method and vice versa. For example, if a specific component of a device is described, a corresponding method for manufacturing the device may include an act of providing the component in a suitable manner, even if such act is not explicitly described or illustrated in the figures.

Although the disclosure has been shown and described with respect to one or multiple implementations, equivalent alterations and modifications will occur to others skilled in the art based at least in part upon a reading and understanding of this specification and the annexed drawings. The disclosure includes all such modifications and alterations and is limited only by the concept of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or multiple other features of the other implementations as may be desired and advantageous for any given or particular application.

The invention claimed is:

1. A method, comprising:
providing a metal layer comprising multiple recesses in a surface thereof defining sections of the metal layer between adjacent recesses;
providing a semiconductor wafer comprising multiple semiconductor dies, wherein each of the semiconductor dies comprises an electrical contact arranged on a surface of the semiconductor wafer;
aligning the sections of the metal layer between adjacent recesses with the electrical contacts;
joining the electrical contacts and the sections of the metal layer; and
thinning a back of the semiconductor wafer.

2. The method of claim 1, wherein before thinning the back of the semiconductor wafer, applying an adhesive to the surface of the semiconductor wafer, the adhesive covering side surfaces and a top of the electrical contacts.

3. The method of claim 1, wherein footprints of the electrical contacts and footprints of the sections of the metal layer are substantially congruent, when viewed in a direction perpendicular to the surface of the semiconductor wafer.

4. The method of claim 1, wherein joining the electrical contacts and the sections of the metal layer comprises at least one of a diffusion bonding act, a pre-sintering act, or a sintering act.

5. The method of claim 1, further comprising:
aligning recesses of the metal layer with scribe lines of the semiconductor wafer.

6. The method of claim 1, further comprising:
before joining the electrical contacts and the sections of the metal layer, filling the recesses with an electrically insulating material.

7. The method of claim 6, wherein the electrically insulating material comprises at least one of a resist, an epoxy, an imide, or a mold compound.

8. The method of claim 6, further comprising:
after joining the electrical contacts and the sections of the metal layer, removing material from a surface of the metal layer until the electrically insulating material is uncovered at the surface of the metal layer; and
removing the electrically insulating material.

9. The method of claim 1, wherein the metal layer comprises at least one of a metal foil, a metal sheet, a metal leadframe, or a metal plate.

10. The method of claim 1, further comprising:
providing at least two openings in the metal layer; and
aligning the metal layer with the semiconductor wafer based on using the openings as alignment marks.

11. The method of claim 1, further comprising:
singulating the metal layer and the semiconductor wafer into multiple semiconductor devices.

12. A method, comprising:
providing a metal layer comprising multiple recesses in a surface thereof defining sections of the metal layer between adjacent recesses;
providing a semiconductor wafer comprising multiple semiconductor dies, wherein each of the semiconductor dies comprises an electrical contact arranged on a surface of the semiconductor wafer;
aligning the sections of the metal layer between adjacent recesses with the electrical contacts;
joining the electrical contacts and the sections of the metal layer;
applying an adhesive to the surface of the semiconductor wafer, the adhesive covering side surfaces and a top of the electrical contacts;
thinning a back of the semiconductor wafer; and
wherein footprints of the electrical contacts and footprints of the sections of the metal layer are substantially congruent, when viewed in a direction perpendicular to the surface of the semiconductor wafer.

13. The method of claim 12, further comprising:
before joining the electrical contacts and the sections of the metal layer, filling the recesses with an electrically insulating material.

14. The method of claim 13, further comprising:
after joining the electrical contacts and the sections of the metal layer, removing material from a surface of the metal layer until the electrically insulating material is uncovered at the surface of the metal layer; and
removing the electrically insulating material.

15. The method of claim 14, further comprising:
providing at least two openings in the metal layer; and
aligning the metal layer with the semiconductor wafer based on using the openings as alignment marks.

16. The method of claim 12, wherein joining the electrical contacts and the sections of the metal layer comprises at least one of a diffusion bonding act, a pre-sintering act, or a sintering act.

17. The method of claim 12, further comprising:
aligning recesses of the metal layer with scribe lines of the semiconductor wafer.

* * * * *